(12) United States Patent
Salleh et al.

(10) Patent No.: US 8,971,836 B2
(45) Date of Patent: Mar. 3, 2015

(54) METHOD OF ADJUSTING THE RECEIVE FREQUENCY OF AN RF RECEIVER DIE

(71) Applicant: Telekom Malaysia Berhad, Kuala Lumpur (MY)

(72) Inventors: Syahrizal Salleh, Selangor (MY); Mohamad Faizal Hashim, Selangor (MY); Zulkalnain Mohd Yussof, Selangor (MY)

(73) Assignee: Telekom Malaysia Berhad, Kuala Lumpur (MY)

( * ) Notice: Subject to any disclaimer, the term of this patent is extended or adjusted under 35 U.S.C. 154(b) by 56 days.

(21) Appl. No.: 13/898,784

(22) Filed: May 21, 2013

(65) Prior Publication Data

US 2013/0309990 A1 Nov. 21, 2013

(30) Foreign Application Priority Data

May 21, 2012 (MY) .............................. PI2012700303

(51) Int. Cl.
*H04B 1/16* (2006.01)
*H04B 1/00* (2006.01)
*H01L 23/66* (2006.01)
*H01L 23/00* (2006.01)

(52) U.S. Cl.
CPC ................. *H04B 1/16* (2013.01); *H04B 1/005* (2013.01); *H01L 2224/32013* (2013.01); *H01L 23/66* (2013.01); *H01L 24/29* (2013.01); *H01L 24/32* (2013.01); *H01L 24/48* (2013.01); *H01L 24/83* (2013.01); *H01L 2224/29007* (2013.01); *H01L 2224/291* (2013.01); *H01L 2224/2929* (2013.01); *H01L 2224/293* (2013.01); *H01L 2224/32145* (2013.01); *H01L 2224/48157* (2013.01); *H01L 2224/83801* (2013.01); *H01L 2224/83851* (2013.01); *H01L 2223/6644* (2013.01)
USPC ........... 455/341; 455/130; 455/133; 455/209; 455/255; 455/280

(58) Field of Classification Search
CPC ............... H04B 1/16; H04B 1/24; H04B 1/26
USPC .............. 455/130, 133, 168.1, 209, 255, 264, 455/252.1, 280, 341
See application file for complete search history.

(56) References Cited

U.S. PATENT DOCUMENTS 8,385,875 B2 * 2/2013 Yoshizaki et al. ............ 455/333
2009/0195477 A1 * 8/2009 Thiam et al. .................. 343/893

* cited by examiner

*Primary Examiner* — Tuan Pham
(74) *Attorney, Agent, or Firm* — Jacobson Holman, PLLC.

(57) ABSTRACT

Disclosed is a method of adjusting the receive frequency of a radio frequency (RF) receiver die (4), the RF receiver die (4) comprising a mixer (8) with an associated local oscillator (10) and a first low-noise amplifier (6) arranged to operate over a first frequency range, the method comprising affixing a second low-noise amplifier (40) arranged to operate over a second frequency range to the RF receiver die (4).

18 Claims, 6 Drawing Sheets

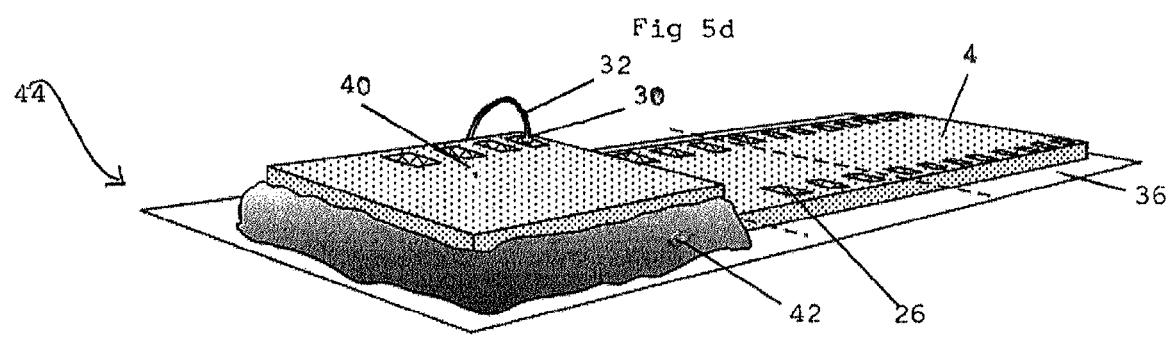

US 8,971,836 B2

METHOD OF ADJUSTING THE RECEIVE FREQUENCY OF AN RF RECEIVER DIE

FIELD OF THE INVENTION

The present invention is generally related to an RF receiver die and particularly, although not exclusively, related to a homodyne zero-IF receiver comprising a low-noise amplifier.

BACKGROUND TO THE INVENTION

Radio frequency (RF) receiver circuits are widespread in use and have various applications, for example, in radios, televisions, telecommunication devices, RFID, medical imaging and more. Typically an RF receiver is designed for a particular application in which it must operate at a certain frequency or over a range of certain frequencies. Once designed, multiple copies of the RF receiver die can be fabricated on a silicon wafer.

An RF receiver die may comprise a low-noise amplifier (LNA) and other components, where the resonant frequency of the LNA dictates the frequency of the receiver circuit, and therefore potential suitable applications.

There can be surges in demand for RF receiver dies at a particular niche frequency as applications are invented or improved. However, it can be expensive and time consuming to design and fabricate new RF receiver dies for those niche frequencies when such surges in demand are experienced.

It is to be understood that, if any prior art publication is referred to herein, such reference does not constitute an admission that the publication forms a part of the common general knowledge in the art, in Australia or any other country.

SUMMARY OF THE INVENTION

In a first aspect the invention broadly comprises a method of adjusting the receive frequency of an RF receiver die, the RF receiver die comprising a mixer with an associated local oscillator and a first low-noise amplifier arranged to operate over a first frequency range, the method comprising:

affixing a second low-noise amplifier arranged to operate over a second frequency range to the RF receiver die.

In an embodiment, the method comprises the step of connecting the output of the second low-noise amplifier to the input of the mixer.

In an embodiment, the method comprises the step of adjusting the frequency of the local oscillator.

In an embodiment, the second low-noise amplifier is affixed to the RF receiver die with an electrically conductive adhesive.

In an embodiment, the second low-noise amplifier is affixed to the RF receiver die with solder.

In an embodiment, the second low-noise amplifier is electrically connected to a base circuit board ground plane.

In an embodiment, the second low-noise amplifier is affixed to the first low-noise amplifier.

In an embodiment, the second low-noise amplifier is affixed to the top of the first low-noise amplifier.

In an embodiment, the overall length and width of the RF receiver die remains unchanged.

In an embodiment, the RF receiver die is one of a homodyne zero-IF receiver, a homodyne non-zero-IF receiver, a heterodyne receiver, a wideband-IF receiver, or a low-IF receiver.

In an embodiment, the mixer is either a passive mixer or a wideband resonance active mixer.

In a second aspect the invention broadly comprises an RF receiver apparatus comprising:
an RF receiver die comprising:
a mixer with an associated local oscillator; and
a first low-noise amplifier arranged to operate over a first frequency range; and
a second low-noise amplifier arranged to operate over a second frequency range affixed to the RF receiver die.

In an embodiment, the output of the second-low noise amplifier is connected to the input of the mixer.

In an embodiment, the second low-noise amplifier is affixed to the RF receiver die with an electrically conductive adhesive.

In an embodiment, the second low-noise amplifier is affixed to the RF receiver die with solder.

In an embodiment, the second low-noise amplifier is electrically connected to a base circuit board ground plane.

In an embodiment, the second low-noise amplifier is affixed to the first low-noise amplifier.

In an embodiment, the second low-noise amplifier is affixed to the top of the first low-noise amplifier.

In an embodiment, the RF receiver die is one of a homodyne zero-IF receiver, a homodyne non-zero-IF receiver, a heterodyne receiver, a wideband-IF receiver, or a low-IF receiver.

In an embodiment, the mixer is either a passive mixer or a wideband resonance active mixer.

In a third aspect the invention broadly comprises a kit of parts comprising:
an RF receiver die comprising:
a mixer with an associated local oscillator; and
a first low-noise amplifier arranged to operate over a first frequency range; and
a second low-noise amplifier arranged to operate over a second frequency range and arranged to be affixed to the RF receiver die.

In an embodiment, the kit of parts comprises an electrically conductive affixing material.

BRIEF DESCRIPTION OF THE DRAWINGS

An embodiment, incorporating all aspects of the invention, will now be described by way of example only with reference to the accompanying drawings in which:

FIG. 5d is a perspective view of the RF receiver apparatus of FIG. 4.

DETAILED DESCRIPTION OF EMBODIMENTS OF THE INVENTION

The invention is generally related to a method of adjusting the receive frequency of an RF receiver die comprising an LNA arranged to operate over a particular frequency range.

Figure 1:
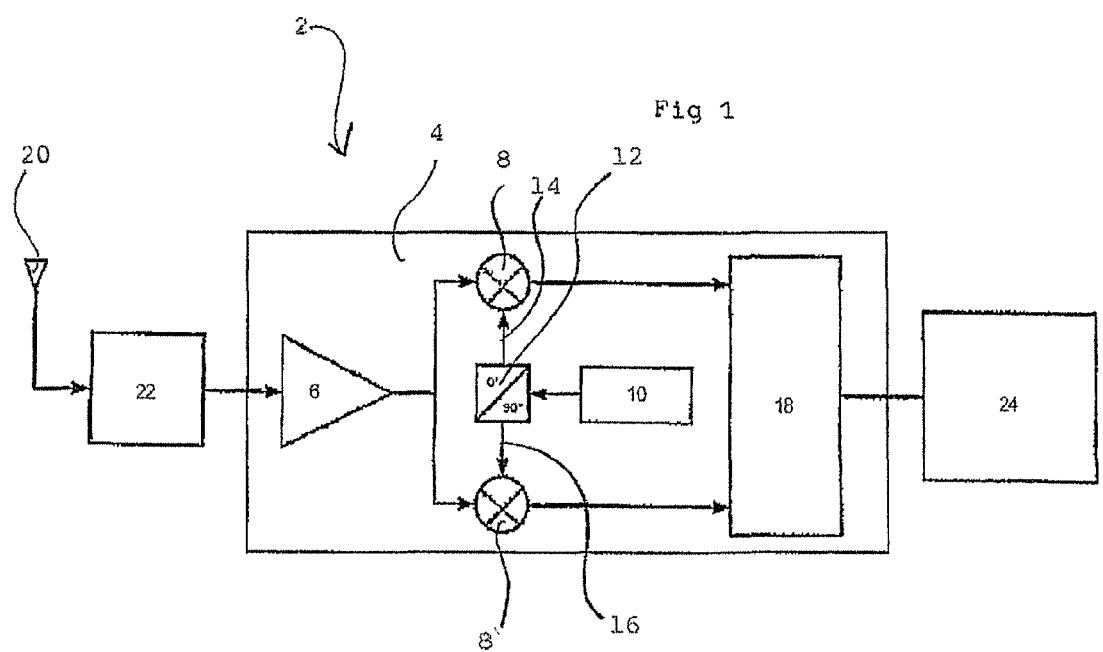
FIG. 1 is a block diagram of a homodyne zero-IF receiver.

Referring to FIG. 1, an RF receiver 2 may be fabricated on an RF receiver die 4 which may then be assembled into an integrated circuit package (not shown). The RF receiver 2 illustrated is a homodyne zero-IF receiver, however other suitable receiver architectures may be used such as heterodyne, non-zero-IF homodyne, wideband-IF and low-IF.

The RF receiver die 4 comprises a first LNA 6 arranged to operate over a first frequency range which is suitable for a particular application. The die also comprises one or more mixers 8 and a local oscillator 10 associated with the one or more mixers 8. Each mixer 8 may be a passive mixer, a wideband resonance active mixer, or any other suitable mixer. In this example the signal from the local oscillator 10 is input to a phase shifter 12 and its in-phase component 14 and quadrature component 16 are separately mixed with the output signal from the first LNA 6. The RF receiver die 4 may also comprise additional integrated components 18 which may include, for example, low-pass filters, variable gain amplifiers and analogue-to-digital converters.

Typically in operation, the RF receiver 2 receives an electromagnetic signal at an antenna 20 which converts the signal into an electrical current. The signal may then be passed through one or more front-end external component 22 which may include a preselection or bandpass filter and impedance matching components. The signal is then amplified by the first LNA 6 and split to be mixed with an in-phase component 14 and quadrature component 16 of a signal generated by the local oscillator 10, such that the signal is now at baseband frequencies. The in-phase and quadrature components of the signal may be passed through the additional integrated components 18 and into a final processing stage 24 which may include a digital signal processor, physical layer, MAC layer and any additional circuitry.

Figure 2:
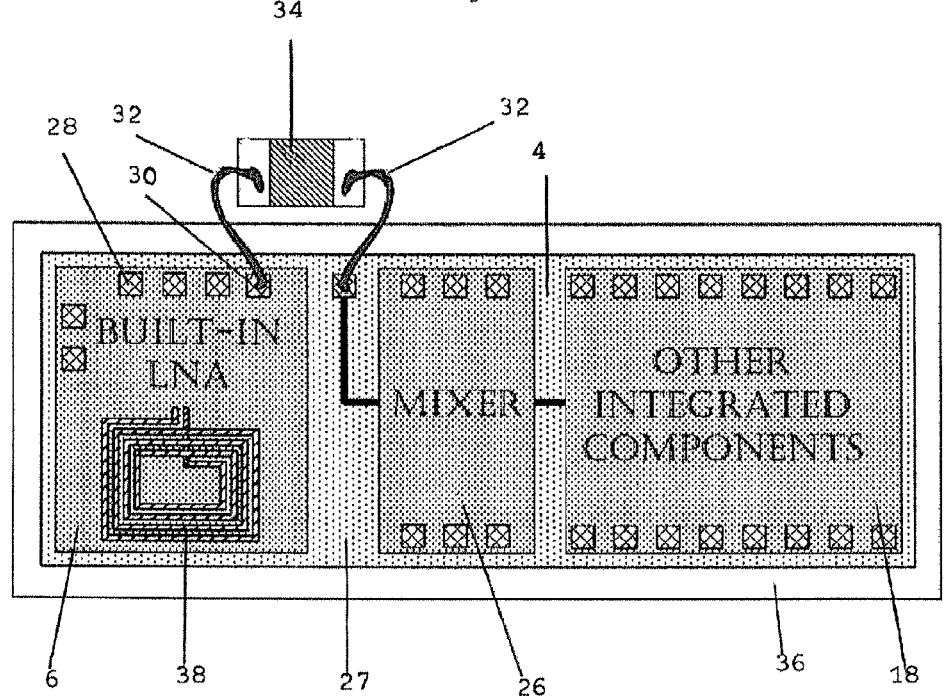
FIG. 2 is a top-down view of an RF receiver die of the invention comprising a first LNA arranged to operate in a first frequency.

Referring to FIG. 2, the RF receiver die 4 may comprise as separate components the first LNA 6, a mixer assembly 26 (which may comprise one or more mixers, phase shifters, local oscillators or any other suitable components), and any additional integrated components 18. The separate components may be provided on a single piece of silicon 27. The first LNA 6 typically has an RF input pad 28 arranged to receive a signal from the antenna and any provided front-end external components (not shown in FIG. 2). The first LNA 6 typically has an RF output pad 30 arranged to be connected to the mixer assembly 26 in any suitable manner such as through a wire lead 32, a test probe circuit board 34, and a second wire lead 32. The RF receiver die 4 and single piece of silicon 27 is generally connected to, surrounded by, or in proximity to a base circuit board ground plane 36 when a base circuit board (not shown) is provided.

Generally there is an inductor associated with the LNA (for example, inductor 38 on the first LNA 6) which dictates its resonant frequency or receive frequency range. The inductor is typically the only inductor associated with the RF receiver die so that the inductor, and therefore the particular LNA, dictates the resonant frequency, receive frequency range or application of the entire RF receiver die.

Figure 3:
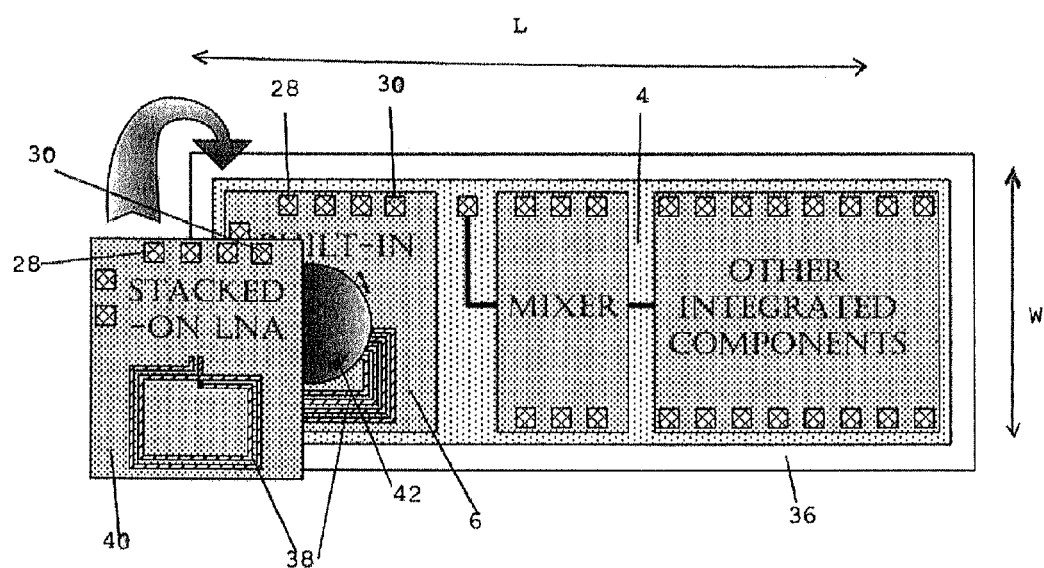
FIG. 3 is a top-down view of the RF receiver die of FIG. 2 undergoing operating frequency adjustment.

Referring to FIG. 3, the receive frequency of the RF receiver die 4 can be adjusted or changed by affixing a second LNA 40 arranged to operate over a second frequency range to the RF receiver die 4. The second LNA 40 will generally have similar components to the first LNA 4, such as an RF input pad 28 and an RF output pad 30. The second LNA 40 may also have an associated inductor 38 with a different resonant frequency to the inductor 38 of the first LNA 6. The second LNA 40 may be the same or similar physical size as the first LNA 4. The second LNA 40 may be affixed to the RF receiver die 4 with an electrically conductive affixing material 42 such as an electrically conductive adhesive, solder or in any other suitable manner such that an electrical connection can be made between the second LNA 40 and the ground plane 36 when provided. In an advantageous embodiment, the second LNA 40 is affixed to the first LNA 6. In an embodiment, the second LNA 40 is affixed directly on top of the first LNA 6. In this more advantageous embodiment, the overall length L and width W of the RF receiver die 4 (not including the material used for affixing) remains unchanged, although the height (out of the page) may increase.

Figure 4:
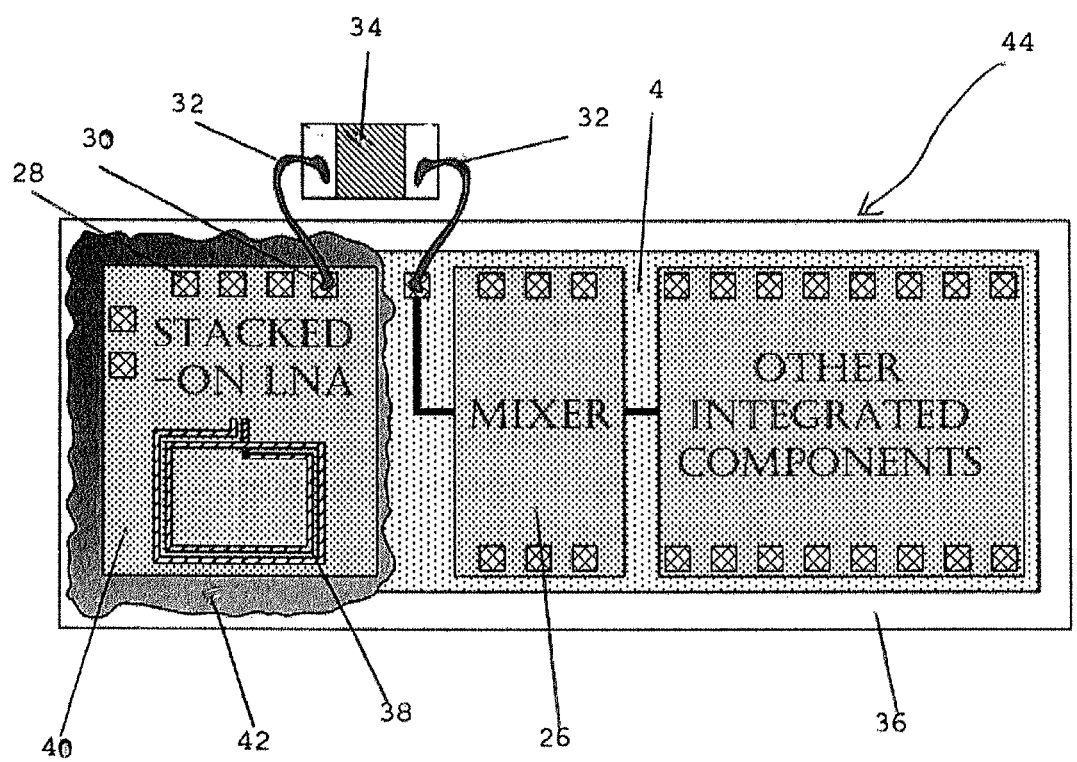
FIG. 4 is a top-down view of an RF receiver apparatus with a second LNA arranged to operate in a second frequency affixed thereon.

Referring to FIG. 4, the electrically conductive affixing material 42 may be spread and cured such that the second LNA 40 can be affixed to the RF receiver die 4 resulting in an RF receiver apparatus 44 that is arranged to operate over a second frequency range. Typically the second LNA 40 is affixed to the RF receiver die 4 such that the second LNA 40 is electrically connected to the ground plane 36 when one is provided. This may be achieved, for example, by having the electrically conductive affixing material 42 spill from under the second LNA 40 and onto the ground plane 36. The RF input pad 28 of the second LNA 40 may be suitably connected to an antenna and any other front end external components. The RF output pad 30 of the second LNA 40 may be suitably connected to the input of the mixer assembly 26 such as through two wire leads 32 and a test probe circuit board 34. It may be necessary to adjust the frequency of the local oscillator when the second LNA 40 has been affixed to and changed the frequency response of the RF receiver die 4. The local oscillator may need to be adjusted such that the in-phase and quadrature components of the signal are brought to the correct baseband frequencies for processing.

Although this arrangement typically bypasses the first LNA 6, it may be possible to use one or more switches and associated electronic circuitry to switch between the first LNA 6 and the second LNA 40. This may allow the RF receiver die 4 to be operated at the frequency of the first LNA 6 or the frequency of the second LNA 40 as desired.

Figure 5A:
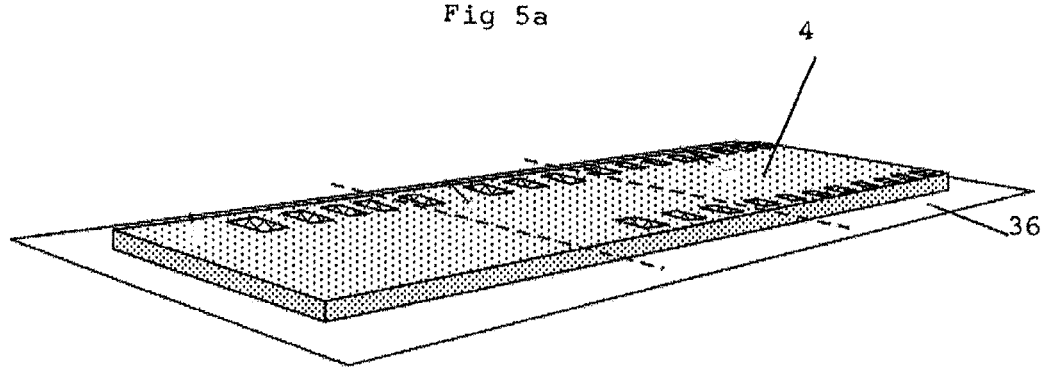
FIGS. 5a to 5c are a series of perspective views of the RF receiver die of FIG. 2 undergoing operating frequency adjustment.
Figure 5B:
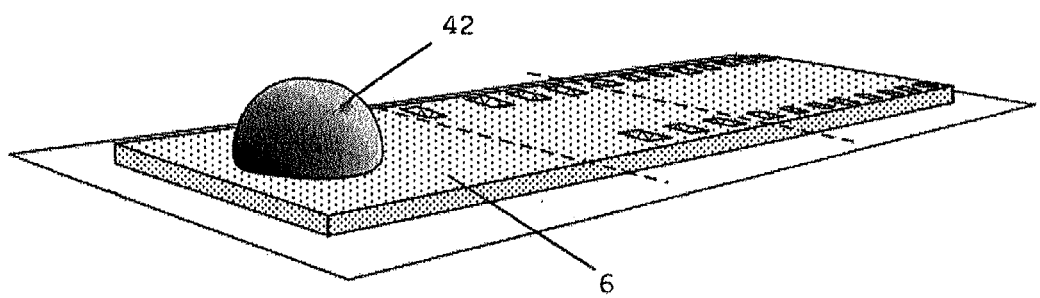
Figure 5C:
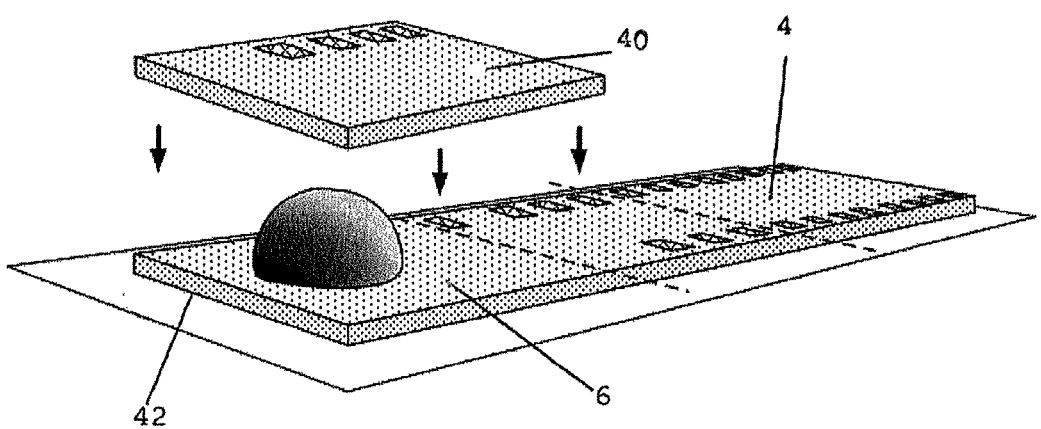

Referring to FIGS. 5a, 5b, 5c and 5d, the method of adjusting the receive frequency of an RF receiver die 4 is illustrated from a perspective view. Referring to FIG. 5a, in some embodiments the RF receiver die 4 is provided on or in proximity to the ground plane 36 of a base circuit board (not shown). Referring to FIG. 5b, an electrically conductive affixing material 42 may be dispensed on top of the existing first LNA 6. Referring to FIGS. 5c and 5d, a second LNA 40 may be affixed directly on top of the first LNA 6 such that the second LNA 40 is stacked on the first LNA 6. Referring only to FIG. 5d, in an advantageous embodiment of the RF receiver apparatus, the electrically conductive affixing material 42 creates an electrical connection between the second LNA 40 and the ground plane 36. The frequency of the local oscillator may be suitably adjusted. Finally, the RF output pad 30 of the second LNA 40 may be connected to the input of the mixer assembly 26, for example, with a wire lead 32.

The invention may be used for any suitable application. For example, an RF receiver die 4 or chain arranged to receive a frequency of 900 MHz (in the GSM spectrum) may be popular and widely available. That RF receive die 4 may be converted to work at, for example, 450 MHz or 700 MHz (which may be suitable to use as a WiMAX front end receiver) by affixing a suitably tuned second LNA 40 to the RF receiver die 4. When there is a surge in demand for RF receiver dies at a niche frequency, it may be faster and cheaper to adjust the frequency of an existing die than to design and fabricate a new die. Generally, an RF receiver die may be four or more times larger than an LNA and so it may be more economical to fabricate only a new LNA rather than an entire RF receiver die.

It will be understood to persons skilled in the art of the invention that many modifications may be made without departing from the spirit and scope of the invention.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art in any country.

The invention claimed is:

1. A method of adjusting the receive frequency of an RF receiver die, the RF receiver die comprising: i) a ground connection, ii) a mixer with an associated local oscillator, and iii) a first low-noise amplifier arranged to operate over a first frequency range, the method comprising:
    affixing a second low-noise amplifier to the first low-noise amplifier with an electrically conductive adhesive that electrically connects the second low-noise amplifier to the ground connection, where the second low-noise amplifier is arranged to operate over a second frequency range.

2. The method of claim 1 comprising the step of connecting the output of the second low-noise amplifier to the input of the mixer.

3. The method of claim 1 comprising the step of adjusting the frequency of the local oscillator.

4. The method of claim 1 where the second low-noise amplifier is affixed to the RF receiver die with solder.

5. The method of claim 1 where the ground connection comprises a ground plane.

6. The method of claim 1 where the second low-noise amplifier is affixed to the top of the first low-noise amplifier.

7. The method of claim 1 where the overall length and width of the RF receiver die remains unchanged.

8. The method of claim 1 where the RF receiver die is one of a homodyne zero-IF receiver, a homodyne non-zero-IF receiver, a heterodyne receiver, a wideband-IF receiver, or a low-IF receiver.

9. The method of claim 1 where the mixer is either a passive mixer or a wideband resonance active mixer.

10. An RF receiver apparatus comprising:
    an RF receiver die comprising:
        a ground connection:
        a mixer with an associated local oscillator; and
        a first low-noise amplifier arranged to operate over a first frequency range; and
    a second low-noise amplifier affixed to the first low-noise amplifier with an electrically conductive adhesive that electrically connects the second low-noise amplifier to the ground connection, where the second low-noise amplifier is arranged to operate over a second frequency range.

11. The RF receiver apparatus of claim 10 where the output of the second-low noise amplifier is connected to the input of the mixer.

12. The RF receiver apparatus of claim 10 where the second low-noise amplifier is affixed to the RF receiver die with solder.

13. The RF receiver apparatus of claim 10 where the ground connection comprises a ground plane.

14. The RF receiver apparatus of claim 10 where the second low-noise amplifier is affixed to the top of the first low-noise amplifier.

15. The RF receiver apparatus of claim 10 where the RF receiver die is one of a homodyne zero-IF receiver, a homodyne non-zero-IF receiver, a heterodyne receiver, a wideband-IF receiver, or a low-IF receiver.

16. The RF receiver apparatus of claim 10 Where the mixer is either a passive mixer or a wideband resonance active mixer.

17. A kit of parts comprising:
    an RF receiver die comprising:
        a ground connection;
        a mixer with an associated local oscillator; and
        a first low-noise amplifier arranged to operate over a first frequency range;
    an electrically conductive affixing material: and
    a second low-noise amplifier arranged to be affixed to the first low-noise amplifier with the electrically conductive affixing material, where the electrically conductive affixing material is arranged to electrically connect the second low-noise amplifier to the ground connection, and where the second low-noise amplifier is arranged to operate over a second frequency range.

18. The kit of parts according to claim 17 where the ground connection comprises a ground plane.

* * * * *